United States Patent
Takata et al.

[11] Patent Number: 6,038,162
[45] Date of Patent: Mar. 14, 2000

[54] SEMICONDUCTOR MEMORY DEVICE

[75] Inventors: Hidekazu Takata; Hidehiko Tanaka, both of Nara, Japan

[73] Assignee: Sharp Kabushiki Kaisha, Osaka, Japan

[21] Appl. No.: 09/256,941

[22] Filed: Feb. 24, 1999

[30] Foreign Application Priority Data

Feb. 24, 1998 [JP] Japan .................. 10-041455

[51] Int. Cl.$^7$ .................................................. G11C 11/22
[52] U.S. Cl. ............................................ 365/145; 365/149
[58] Field of Search ................................. 365/145, 149, 365/189.09, 210

[56] References Cited

U.S. PATENT DOCUMENTS

| | | | |
|---|---|---|---|
| 5,517,445 | 5/1996 | Imai et al. ................................. | 365/145 |
| 5,671,174 | 9/1997 | Koike et al. .............................. | 365/145 |
| 5,764,561 | 6/1998 | Nishimura ................................ | 365/145 |

OTHER PUBLICATIONS

Sumi et al. "FA 16.2: A 256kb Nonvolitile Ferroelectric Memory at 3V and 100ns" (IEEE International Solid–State Circuits Conference 1994) *Digest of Technical Papers* 268–269.

*Primary Examiner*—Son Mai
*Attorney, Agent, or Firm*—Morrison & Foerster LLP

[57] ABSTRACT

A semiconductor memory device includes: a plurality of word lines; a plurality of drive lines; a word line driving section for activating one of the plurality of word lines in accordance with a row address; a column selection section for, in accordance with a column address, selecting one of a plurality of ferroelectric memory cells coupled to the activated word line; a plate driving signal application section for applying a plate driving signal to at least a selected one of the plurality of drive lines, the at least one selected drive line being associated with the activated word line; and a switching section for coupling or detaching the plurality of ferroelectric memory cells to or from the at least one selected drive line. The column selection section controls the switching section so that only the selected ferroelectric memory cell is coupled to the at least one selected drive line.

8 Claims, 10 Drawing Sheets

SEMICONDUCTOR MEMORY DEVICE

BACKGROUND OF THE INVENTION

1. Field of the Invention

The present invention relates to a non-volatile semiconductor memory device for storing and retaining information by utilizing different polarization states of a ferroelectric film which is interposed between opposite electrodes of a capacitor.

2. Description of the Related Art

Figure 6:
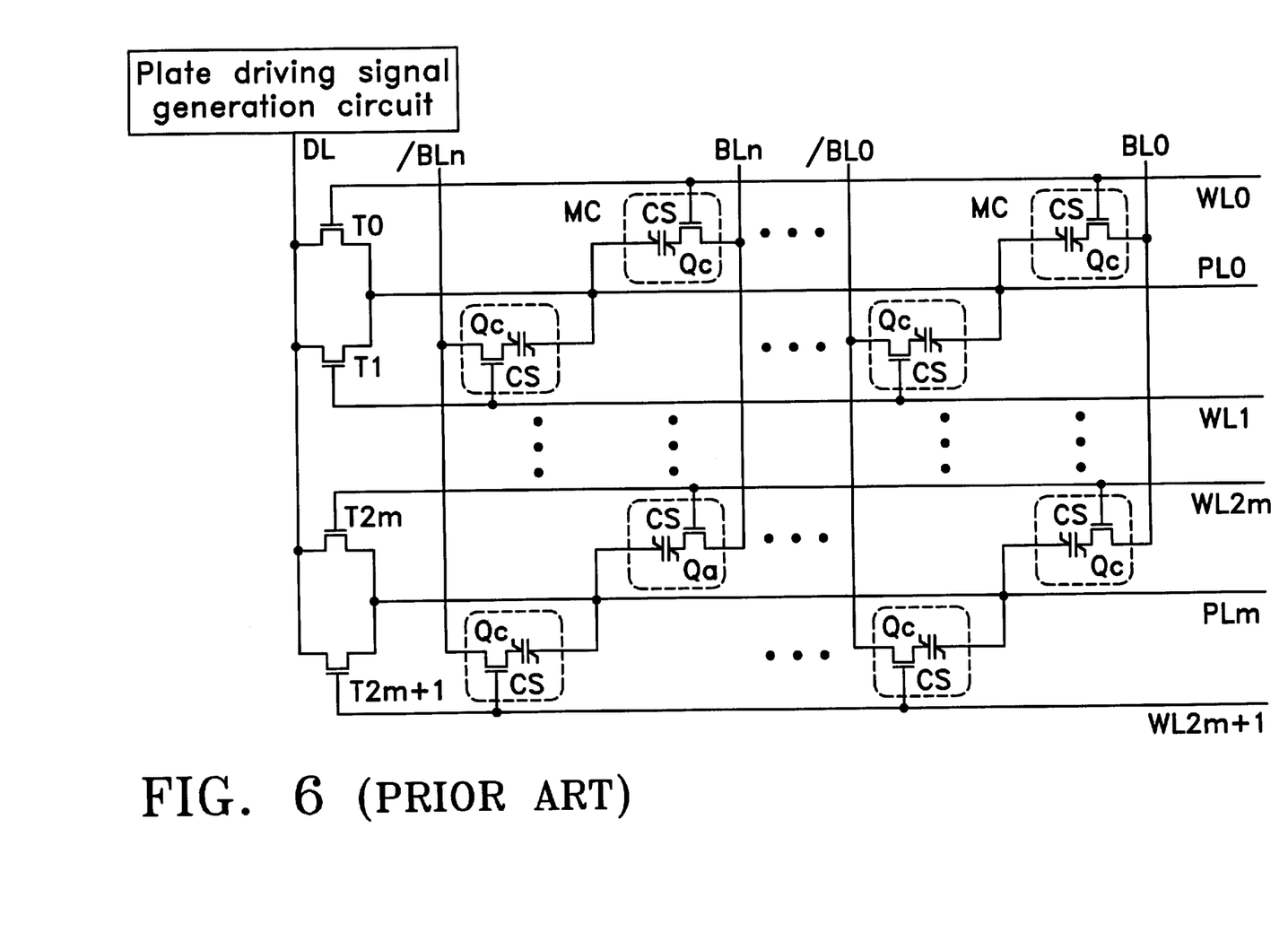
FIG. 6 is a circuit diagram illustrating an example of a conventional ferroelectric memory device.

In general, a semiconductor memory device incorporating a ferroelectric material (hereinafter referred to as a "ferroelectric memory device") is a non-volatile memory which performs data storage based on the polarization directions of the ferroelectric material. FIG. 6 chiefly shows a memory cell portion of a conventional non-volatile semiconductor memory device incorporating a ferroelectric film (see, for example, T. Sumi et al., 1994 IEEE International Solid-State Circuits Conference, DIGEST OF TECHNICAL PAPERS, pp. 268–269).

The ferroelectric memory device shown in FIG. 6 mainly includes a plurality of memory cells MC arranged in a matrix of rows and columns, where each memory cell includes a capacitor Cs consisting essentially of a ferroelectric film interposed between opposite electrodes, and a MOS transistor Qc whose source or drain is coupled to one of the electrodes of the capacitor Cs (hereinafter, the other electrode of each capacitor Cs will be referred to as a "plate electrode", as described below).

The ferroelectric memory device further includes a plurality of word lines WL0 to WL2m+1 provided for the respective rows of memory cells MC so as to be coupled to the gates of the transistors Qc of the respective rows of memory cells MC. When at a "selected" level, the word lines WL0 to WL2m+1 place these memory cells MC in a "selected" state.

The ferroelectric memory device further includes a plurality of bit lines BL0 to BLn and a plurality of bit lines /BL0 to /BLn provided for the respective columns of memory cells MC so as to be coupled to the drains of the transistors Qc of the respective columns of memory cells MC.

The ferroelectric memory device further includes a plurality of plate lines PL0 to PLm such that one plate line is provided for every two rows of memory cells MC and coupled to the "plate electrodes" of every two corresponding capacitors Cs.

The ferroelectric memory device further includes a plurality of MOS transistors T0 to T2m+1 provided for the respective word lines WL0 to WL2m+1 such that their gates are coupled to the respective word lines, their sources are coupled to the respective plate lines, and their drains are coupled to a common drive line DL.

Finally, the ferroelectric memory device includes a plate driving signal generation circuit 1 for supplying a plate driving signal to the drive line DL.

In the present specification, a memory cell which stores information by utilizing the action of a ferroelectric film will be referred to as a "ferroelectric memory cell".

Figure 7:
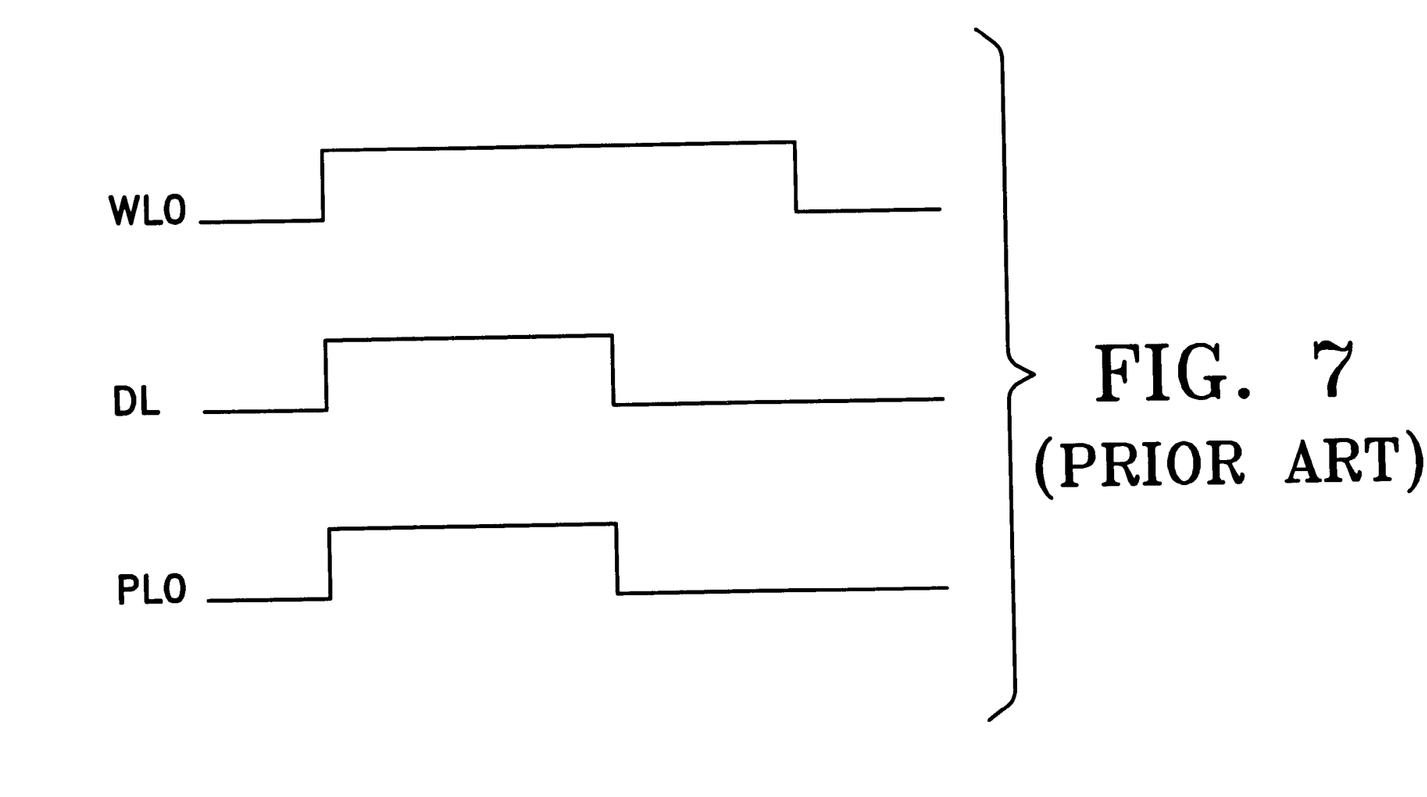
FIG. 7 is a timing diagram of various signals for illustrating the operation of the conventional ferroelectric memory device shown in FIG. 6.

A read operation of the above-described ferroelectric memory device will be described with reference to the timing chart shown in FIG. 7.

In a stand-by state before the word line (e.g., WL0) rises to a "selected" level (i.e., a HIGH level), the bit lines BL0 to BLn, bit lines /BL0 to /BLn, and drive line DL are at a ground potential. As the word line WL0 rises to a HIGH level, the memory cells MC coupled to the word line WL0 become selected; at the same time, the transistor T0 becomes conductive so that the plate line PL0 is coupled to the drive line DL. Then, the plate driving signal shifts to a plate driving voltage Vp1, so that the plate driving voltage Vp1 is supplied to the plate line PL0. As a result, the information stored in the memory cells MC can be read onto the bit lines BL0 to BLn. A reference cell (not shown) is selectively coupled to the bit lines /BL0 to /BLn (which are complementary to the bit lines BL0 to BLn) so as to place the bit lines /BL0 to /BLn at a reference voltage level. The reference voltage level is prescribed (as conveniently accomplished by the adjustment of the capacitor size of the reference cell) to be an intermediate potential between the respective bit line potentials corresponding to "1" and "0" to be stored in a given memory cell MC. The information which is stored in each selected memory cell can be read so as to become available to the outside, by amplifying a differential voltage between corresponding ones of the bit lines BL0 to BLn and complementary bit lines /BL0 to /BLn. Thereafter, the plate driving signal shifts to the ground potential so as to place the plate line PL0 at the ground potential, as a result of which the information which was previously stored in the selected memory cells is rewritten thereto.

In accordance with the conventional ferroelectric memory device shown in FIG. 6, any information is stored by inducing either a positive or negative polarization of the ferroelectric film of the capacitor Cs of each memory cell MC, and any information thus stored is read by detecting the state of the induced polarization. However, since this requires supplying a predetermined potential Vp1 to the plate line as described above, not only the memory cell whose stored information is read but also the other memory cells in the same row or column will be driven. Also, the ferroelectric material incorporated in the capacitor Cs boosts the capacitance up to a value which is larger than that typically used in a usual DRAM.

Moreover, the plate lines are typically formed of precious metals, e.g., Au, Pt, and Ru for matching with the ferroelectric material. It is difficult to form a relatively thick film out of such precious metals due to their processibility problems, and it is undesirable to employ broad wiring leads in terms of miniaturization of the device and enhancement in the mounting density of the device. Hence, the plate lines will inevitably be designed so as to have a relatively high resistance value, which results in a large time constant. This in turn results in a relatively long time being required for driving the plate lines, thereby hindering high-speed operations of the device. In addition, charging and discharging plate lines disadvantageously increases the power consumption of the device.

In summary, the following problems may arise in the above-described conventional ferroelectric memory device in which the plate lines must be driven to a predetermined potential every time access is made: a relatively long time being required for driving the plate lines, difficulties in achieving high-speed operations, and increased power consumption due to the charging and discharging of plate lines.

SUMMARY OF THE INVENTION

A semiconductor memory device according to the present invention includes: a plurality of word lines;

a plurality of drive lines; a word line driving section for activating one of the plurality of word lines in accordance with a row address; a column selection section for, in accordance with a column address, selecting one of a plurality of ferroelectric memory cells coupled to the activated word line; a plate driving signal application section for applying a plate driving signal to at least a selected one of the plurality of drive lines, the at least one selected drive line being associated with the activated word line; and a switching section for coupling or detaching the plurality of ferroelectric memory cells to or from the at least one selected drive line, wherein the column selection section controls the switching section so that only the selected ferroelectric memory cell is coupled to the at least one selected drive line.

In one embodiment of the invention, the switching section couples or detaches the plurality of ferroelectric memory cells to or from the at least one selected drive line with respect to each of the plurality of word lines.

In another embodiment of the invention, each of the plurality of drive lines is associated with more than one of the plurality of word lines, the plate driving signal application section applying the plate driving signal to the drive line associated with any of the activated word lines.

In still another embodiment of the invention, each of the plurality of drive lines is associated with one of the plurality of word lines, the plate driving signal application section applying the plate driving signal to the drive line associated with the activated word line.

In still another embodiment of the invention, each of the plurality of ferroelectric memory cells includes at least one capacitor having two electrodes and at least one transistor, the two electrodes of the capacitor being respectively coupled to one of a source and a drain of the at least one transistor and to the switching section, the gate of the at least one transistor being coupled to one of the plurality of word lines.

Alternatively, a semiconductor memory device according to the present invention includes: a plurality of word lines; a plurality of drive lines; a word line driving section for activating one of the plurality of word lines in accordance with a row address; a column selection section for, in accordance with a column address, selecting one of a plurality of ferroelectric memory cells coupled to the activated word line; a plate driving signal application section for applying a plate driving signal to one of the plurality of drive lines associated with the activated word line, each of the plurality of drive lines being associated with one of the plurality of word lines, wherein the column selection section couples only the selected ferroelectric memory cell to the one of the plurality of drive lines.

In one embodiment of the invention, each of the plurality of ferroelectric memory cells includes a first transistor, a second transistor, and at least one capacitor having two electrodes, the two electrodes of the capacitor being respectively coupled to one of a source and a drain of the first transistor and to one of a source and a drain of the second transistor, the gate of the first transistor being coupled to one of the plurality of word lines, the other of the source and the drain of the second transistor being coupled to one of the plurality of drive lines associated with one of the plurality of word lines, and the gate of the second transistor being coupled to the column selection section, and wherein the column selection section controls the second transistor so as to couple only the selected ferroelectric memory cell to the one of the plurality of drive lines.

Alternatively, a semiconductor memory device according to the present invention includes: a plurality of word lines; a word line driving section for activating at least one of the plurality of word lines in accordance with a row address; a column selection section for, in accordance with a column address, selecting one of a plurality of ferroelectric memory cells coupled to the at least one activated word line; a plate driving signal application section for applying a plate driving signal to a plurality of drive lines coupled to the plurality of ferroelectric memory cells; and a switching section for coupling or detaching the plurality of ferroelectric memory cells to or from the at least one of the plurality of drive lines, wherein each of the plurality of ferroelectric memory cells includes a first transistor, a second transistor, and at least one capacitor having two electrodes, one of the two electrodes of the capacitor being coupled to one of a source and a drain of the first transistor, the other of the two electrodes of the capacitor being coupled to one of a source and a drain of the second transistor, the gate of the first transistor being coupled to one of the plurality of word lines, the other of the source and the drain of the second transistor being coupled to one of the plurality of drive lines, and the gate of the second transistor being coupled to the column selection section, and wherein the column selection section controls the switching section so that only the selected ferroelectric memory cell is coupled to the one of the plurality of drive lines.

Thus, the invention described herein makes possible the advantage of providing a semiconductor memory device which attains both high speed operation and low power consumption.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

EXAMPLE 1

Figure 1:
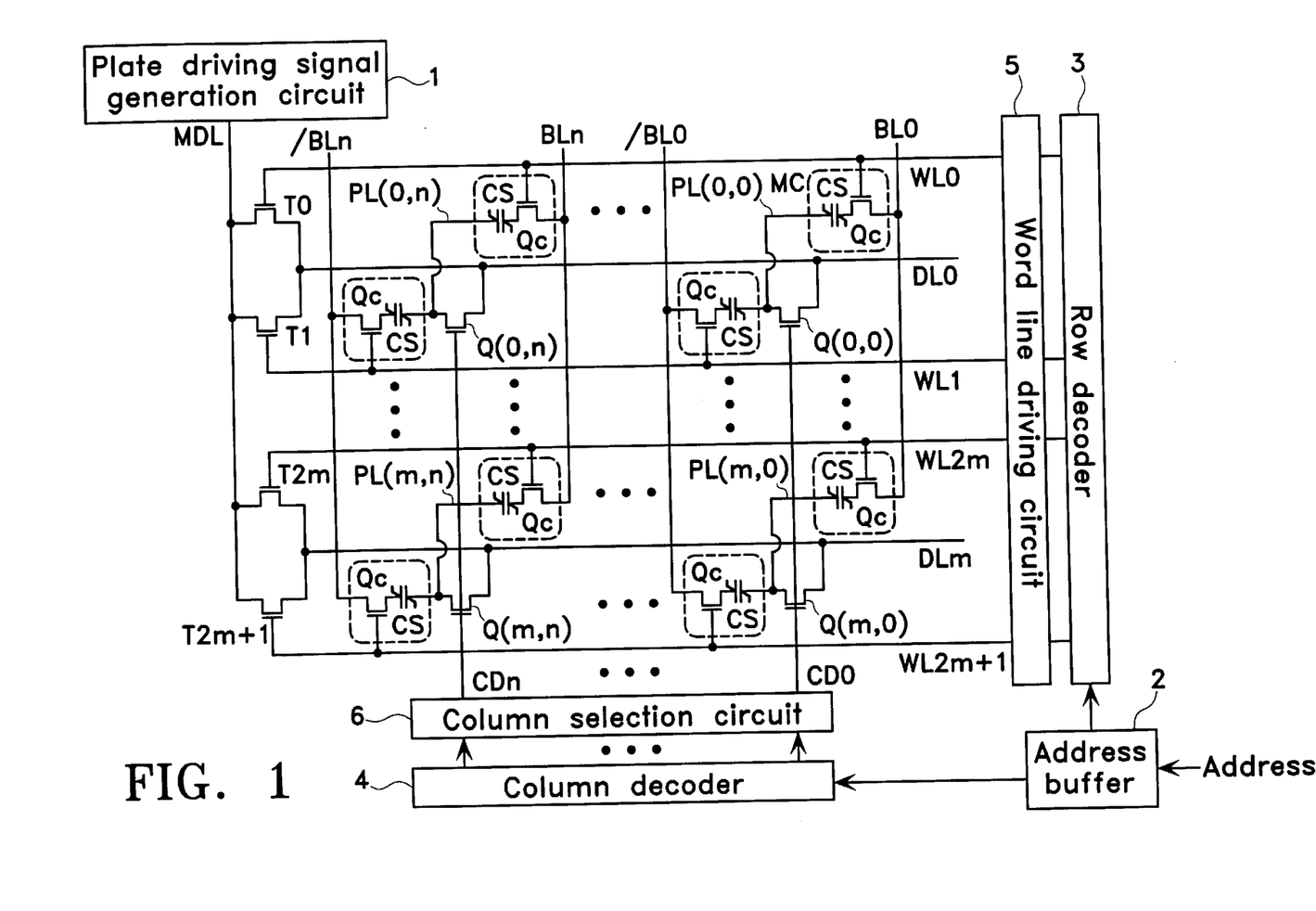
FIG. 1 is a circuit diagram illustrating a memory device according to Example 1 of the present invention.

FIG. 1 is a circuit diagram illustrating a memory device according to Example 1 of the present invention.

In the present specification, a word line is said to be "associated with" a drive line in the case where the word line, which is coupled to a memory cell, is also coupled to a drive line via a transistor. Similarly, a word line is said to be "associated with" a drive line in the case where a plate driving signal is applied to the drive line when the word line is activated.

The memory device of the present example includes a plurality of memory cells MC arranged in a matrix of rows and columns, where each memory cell MC includes a capacitor Cs consisting essentially of a ferroelectric film interposed between opposite electrodes, and a MOS transistor Qc whose source or drain is coupled to one of the electrodes of the capacitor Cs.

The ferroelectric memory device further includes a plurality of word lines WL0 to WL2m+1 provided for the respective rows of memory cells MC so as to be coupled to the gates of the transistors Qc of the respective rows of memory cells MC for selecting one or more rows of memory cells MC.

The ferroelectric memory device further includes a plurality of bit lines BL0 to BLn and a plurality of bit lines /BL0 to /BLn provided for the respective columns of memory cells MC so as to be coupled to the drains or sources of the transistors Qc of the respective columns of memory cells MC.

The ferroelectric memory device further includes a plurality of drive lines DL0 to DLm such that one drive line is provided for every two rows of memory cells MC.

The drive lines DL can be formed of polysilicon leads or usual metal leads (e.g., aluminum leads).

The ferroelectric memory device further includes a plurality of MOS transistors T0 to T2m+1 provided for the respective word lines WL0 to WL2m+1 such that their gates are coupled to the respective word lines, their sources are coupled to the respective drive lines, and their drains are coupled to a main drive line MDL.

The ferroelectric memory device further includes a plate driving signal generation circuit 1 for supplying a plate driving signal to the main drive line MDL.

In the above configuration, the drive lines are provided for applying a voltage to the corresponding capacitors via the MOS transistors T0 to T2m+1 so as to enable reading or writing of information to or from the memory cells MC.

The memory device further includes: a plurality of plate lines PL(0,0) to PL(m,n); a plurality of MOS transistors Q(0,0) to Q(m,n) such that their sources are coupled to the respectively corresponding plate lines PL(0,0) to PL(m,n), their drains are coupled to the respectively corresponding drive lines DL0 to DLm, and their gates are coupled to column selection lines CD0 to CDn; an address buffer 2 for receiving an externally supplied address signal; a row decoder 3 and a column decoder 4 for receiving the outputs from the address buffer 2; a word line driving circuit 5 for receiving an address decode signal which is output from the row decoder 3 and driving one or more of the word lines; and a column selection circuit 6 for receiving an address decode signal which is output from the column decoder 4 and generating column selection signals CD0 to CDn.

With respect to each column, the other electrodes (i.e., the electrodes which are not coupled to the MOS transistor Qc) of the capacitors Cs of the memory cells MC in two adjoining rows are coupled to one another or to a common node, and the plate lines PL(0,0) to PL(m,n).

Although one drive line is provided for every two rows of memory cells MC in the present example, the present invention is not limited thereto. Alternatively, one drive line maybe provided for every row of memory cells MC, so as to further enhance the response speed of the drive lines.

Figure 3A:
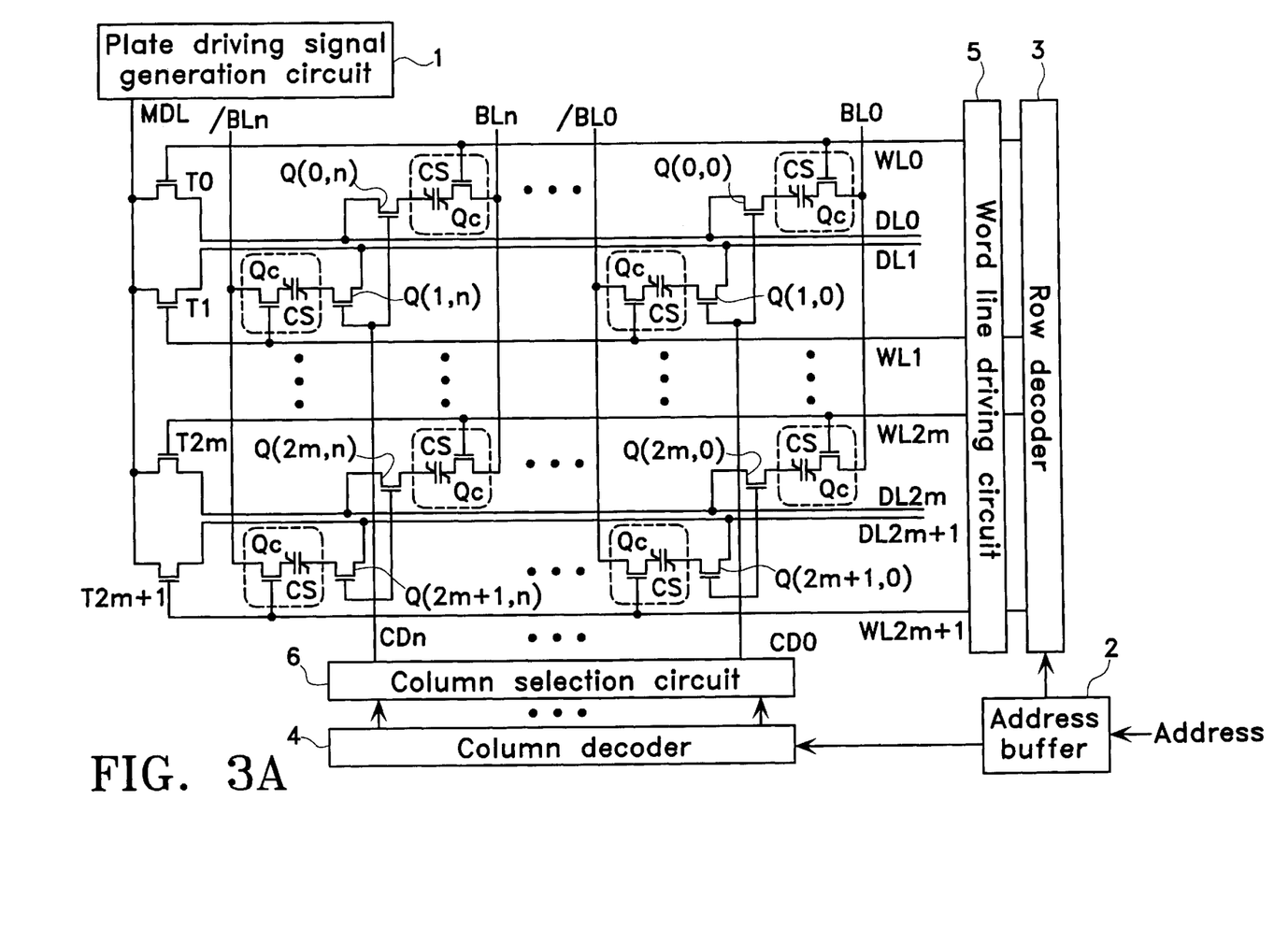
FIGS. 3A to 3C are circuit diagrams each illustrating a modification of the memory device according to the present invention as shown in FIG. 1.
Figure 3B:
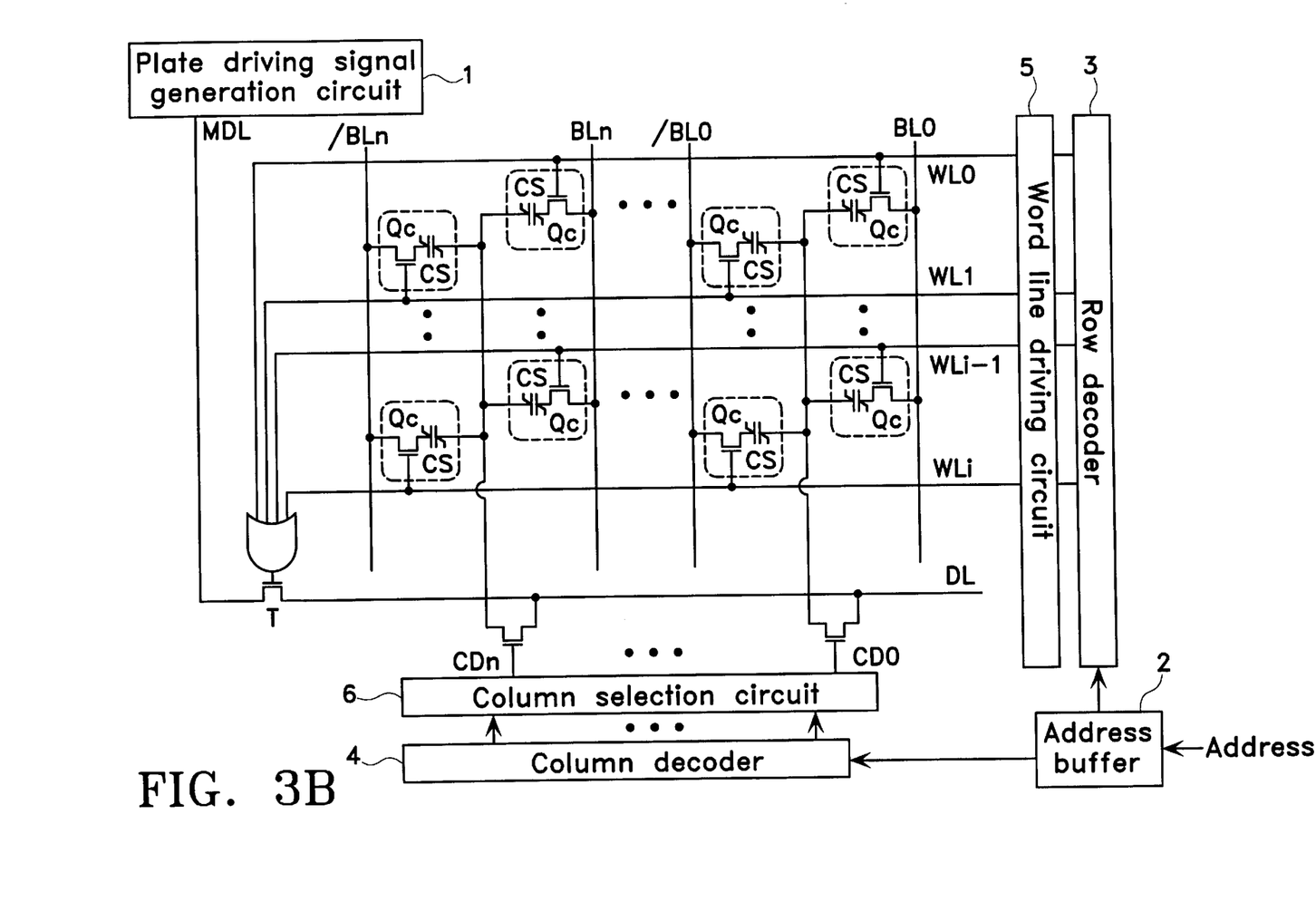
Figure 3C:
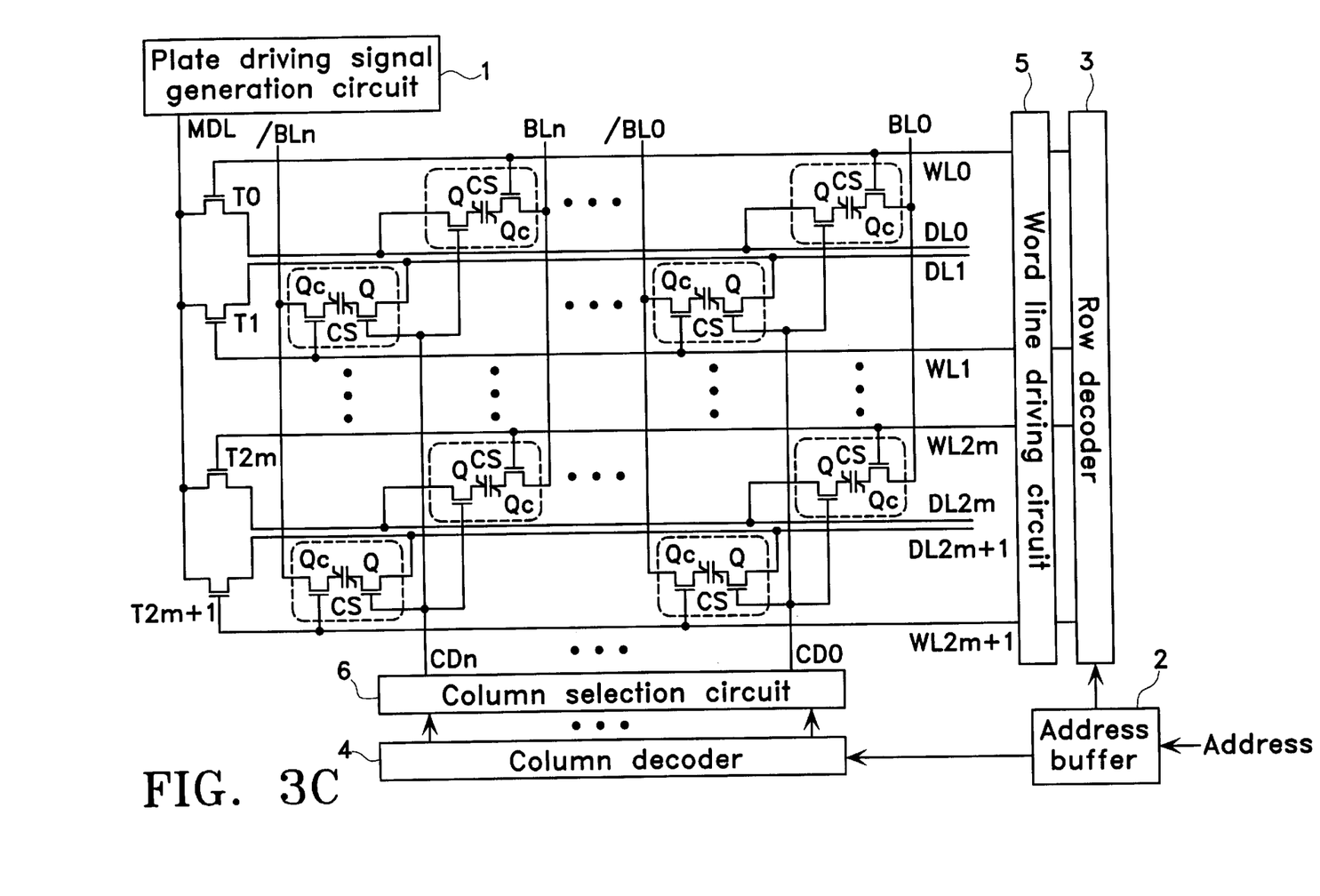

FIGS. 3A to 3C are circuit diagrams illustrating modifications of the memory device according to Example 1 as shown in FIG. 1 where the plate electrodes of the respective memory cell plates are separated (i.e., not coupled to one another or to a common node) along both the row and column directions, with a drive line being provided for every row. Although the following description will primarily concern the configuration illustrated in FIG. 1, it should be noted that the same description also applies to the configurations shown in FIGS. 3A to 3C, except for the aforementioned differences therefrom.

Alternatively, it is also possible to provide one drive line for a larger number of rows (e.g., one for every four or eight lines), thereby reducing the area required for such wiring. As shown in FIG. 3B, in the case where one drive line is provided for more than one rows, a plurality of MOS transistors T can be provided each corresponding to one drive line (as opposed to providing one transistor (T0 to T2m+1) for every word line), such that their sources are coupled to the respectively corresponding drive lines DL, their drains are coupled to the main drive line MDL, and their gates receive a logic OR of the row decode signals respectively corresponding to the one or more rows (e.g., word lines WL0, WL1, . . . etc.).

FIG. 3C shows another example of the memory device according to the present invention as illustrated in FIG. 3A. The operation of the memory device shown in FIG. 3C is identical with that of the memory device shown in FIG. 3A. Structurally, the memory device of FIG. 3C differs from the memory device of FIG. 3A in that the transistors Q(i,j) (where i and j are integers such that $0 \leq i \leq 2m+1$, $0 \leq j \leq n$) illustrated in FIG. 3A, whose switching is controlled by the column selection circuit 6, are provided within the respective memory cells MC. Each transistor Q shown in FIG. 3C represents such a transistor provided within each memory cell MC. By employing such highly-integrated memory cells, it becomes possible to enhance the integration density of the entire memory device, or alternatively reduce the circuit area on the chip.

In the present example, the plate electrodes of more than one memory cells which are juxtaposed along the row direction are coupled to one another or to a common node. In addition, the plate electrodes of more than one memory cells which are juxtaposed along the column direction can also be coupled to one another or to a common node so that the common plate lines PL(0,0) to PL(m,n) will be coupled to their corresponding drive lines DL0 to DLm in response to column selection signals CD0 to CDn. In this case, one transistor Q may be provided for a plurality of rows (or one row) of memory cells, and one transistor Q may be provided for a plurality of columns of memory cells. The gates of any number of transistors which are provided for more than one rows will be coupled to one another along the column direction so as to form a common column selection line. The column selection circuit will be configured so that a "selected" level will be output to the common column selection line when a decode signal for any of the one or more columns is output from the column decoder 4.

Fewer transistors Q(0,0) to Q(m,n) will be required in the memory device as more rows and/or columns are coupled to a common plate line. However, the configuration of the present example, in which the plate lines of the memory cells are not coupled to one another or to a common node along the column direction, will provide for a higher response of each plate line.

Figure 2A:
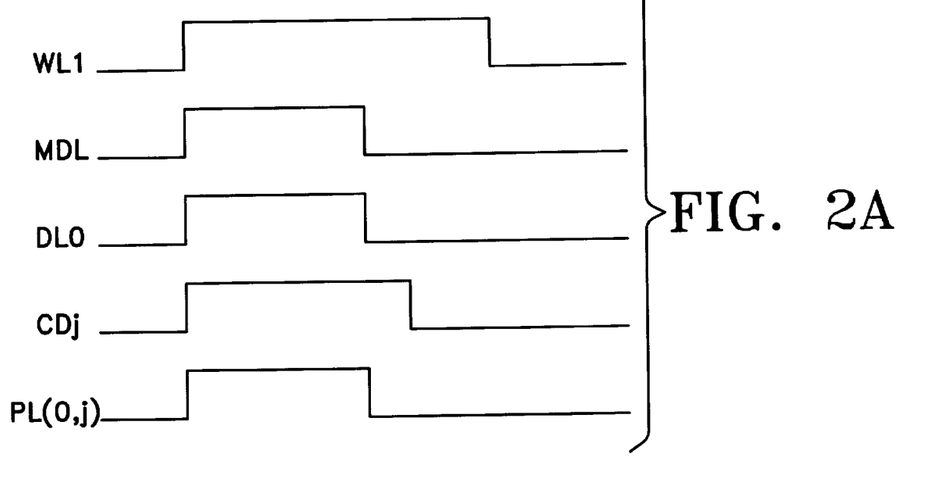
FIGS. 2A and 2B are timing diagrams of various signals for illustrating the operation of the memory device according to Example 1 of the present invention shown in FIG. 1.

Hereinafter, the operation of the memory device shown in FIG. 1 will be described with reference to the timing diagram of FIG. 2A illustrating various signals.

In a stand-by state before the word line (e.g., WL1) rises to a "selected" level (i.e., a HIGH level), the bit lines BL0 to BLn, bit lines /BL0 to /BLn, and the main drive line MDL are at a ground potential.

An external address signal which is input to the address buffer 2 is passed to the row decoder 3 and the column decoder 4. The row decoder 3 decodes a row address from the external address signal; the column decoder 4 decodes a column address from the external address signal. The word line driving circuit 5 activates at least one of the word lines WL0 to WL2m+1 at an address corresponding to the row address which has been decoded by the row decoder 3, whereas the column selection circuit 6 activates at least one of the column selection lines CD0 to CDn at an address corresponding to the column address which has been decoded by the column decoder 4. Herein, the term "activation" refers to a selected line being supplied with a "selected" level signal. The row decoder 3 and the word line driving circuit 5 may be collectively referred to as a "word line driving section", whereas the column decoder 4 and the column selection circuit 6 may be collectively referred to as a "column selection section".

As a word line (e.g., WL1) shifts to the "selected" level, the transistors Qc of the memory cells MC coupled to the word line WL1 become conductive; at the same time, the transistor T1 (coupled to the word line WL1) becomes conductive so that a plate line driving voltage Vp1 is supplied to the corresponding drive line DL0. Thereafter, as a column selection line (e.g., CDj) shifts to the "selected" level in response to an output signal from the column decoder 4, the transistors Q(0,j) to Q(m,j) in the $j^{th}$ column become conductive, so that the voltage Vp1 on the drive line DL0 is supplied to one of the plate lines, i.e., plate line PL(0,j).

As described above, each transistor functions as a switch which opens or closes in accordance with the signal level on the line which is coupled to its gate. In the present specification, the plate driving signal generation circuit 1, the transistors T0 to T2m+1, and the interconnecting main drive line MDL may be collectively referred to as a "plate driving signal application section".

As a result, the information stored in the memory cells MC at the first row and the $j^{th}$ column is read onto the bit lines /BLj.

Figure 8:
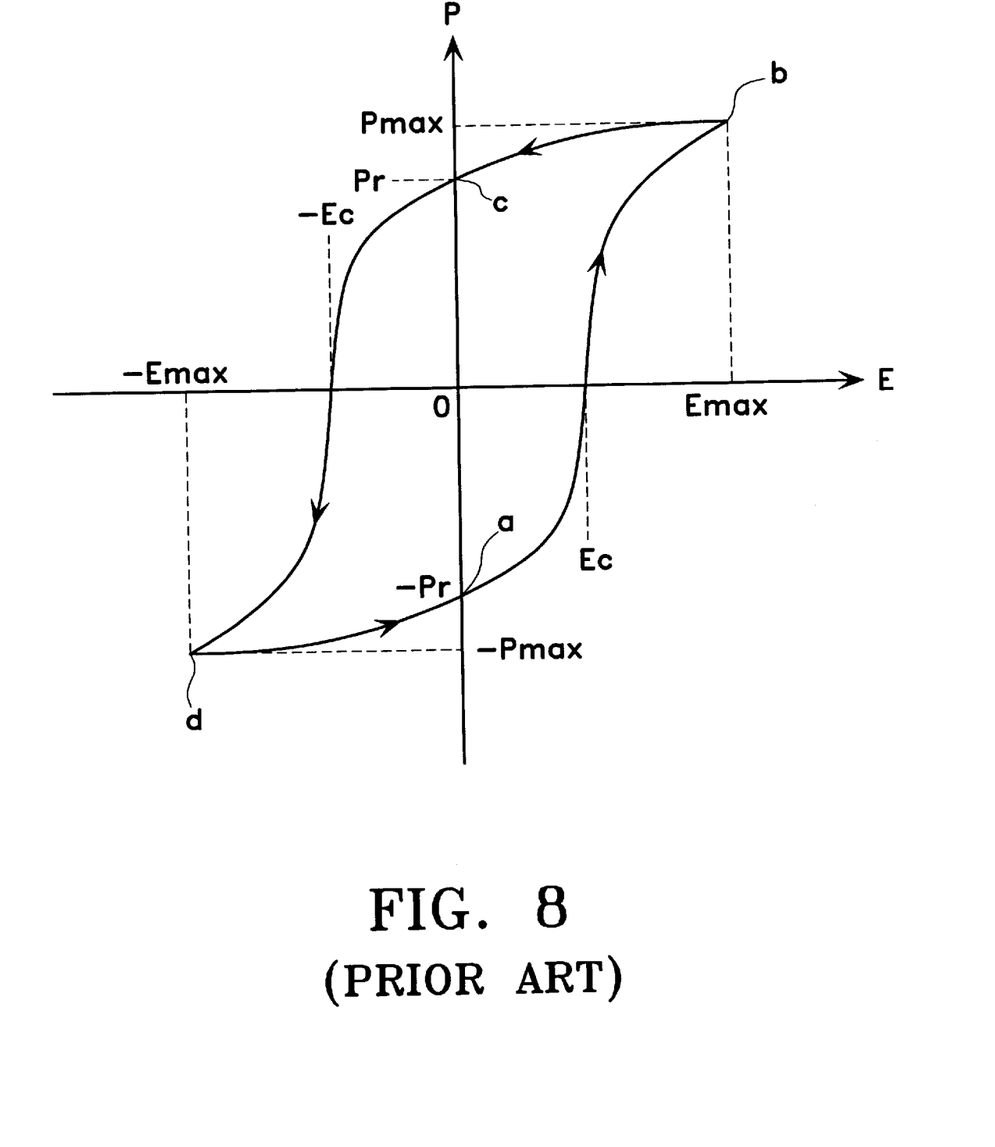
FIG. 8 is a graph showing the hysteresis characteristics of a ferroelectric memory cell with respect to an applied electric field and polarization.

The above operation will be described in more detail with reference to the hysteresis characteristics shown in FIG. 8. By applying a negative electric field $-E_{max}$ between the bit line /BLj and the plate line PL while the transistor Qc is in an ON state, a charge equivalent to Pmax+Pr will be read onto the bit line /BLj from a memory cell storing the data "1" (which corresponds to point c in the hysteresis curve), and a charge equivalent to Pmax−Pr will be read onto the bit line /BLj from a memory cell storing the data "0" (which corresponds to point a in the hysteresis curve).

A reference cell (not shown) is selectively coupled to the bit line BLj (which is complementary to the bit line /BLj) so as to place the bit line BLj at a reference voltage level.

The information which is stored in each selected memory cell can be read and becomes accessible from the outside by amplifying a differential voltage between the complementary pair of bit lines BLj and /BLj. Thereafter, the main driving signal MDL shifts to the ground potential while the column selection line CDj stays at the "selected" level, whereby the plate line PL(0,j) is placed at the ground potential. As a result, the information which was previously stored in the selected memory cells is rewritten thereto.

Figure 2B:
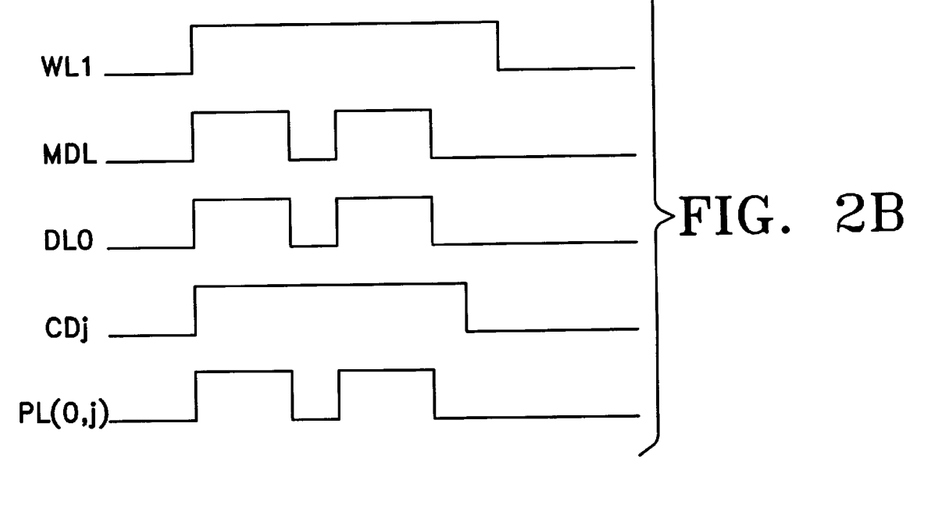

In accordance with the signal timing scheme shown in FIG. 2A, a read operation and a rewrite operation are illustrated as taking place in response to a single main driving signal pulse. Alternatively, the signal timing scheme shown in FIG. 2B can be employed, where a read operation takes place responsive to a first main driving signal pulse and a rewrite operation takes place responsive to a second main driving signal pulse, both of which operations taking place while the word line is maintained at the "selected" level. This allows a rewrite operation to be even more securely performed.

Now, the reason why the rewrite operation is necessary will be described briefly with reference back to FIG. 8. In accordance with the above-described read operation, the polarization state at point c (FIG. 8) shifts to the polarization state at point a (FIG. 8) in response to the application of the electric field $-E_{max}$, that is, the polarization state at point c has been destroyed by the read operation. Hence, a rewrite operation is required to rescue the stored data which has been changed through such destructive reading. Herein, a rewrite operation is defined as an operation, to be performed after a read operation, for restoring the polarization state which existed before the read operation but has been changed as a result of the read operation. A rewrite operation can be accomplished by applying a positive electric field $E_{max}$ to the ferroelectric film so as to cause the polarization state at point a to shift to the polarization state at point c.

In accordance with the above-described operation, the capacitors Cs in the memory cells MC in the non-selected rows (i.e., rows other than the first row) are detached from the bit lines by the switching of the transistors Qc, so that the voltages across the opposite electrodes of those capacitors Cs will not change regardless of whether the voltage Vp1 is applied to the plate lines PL or not. Accordingly, the destruction of the polarization information in such memory cells MC is prevented.

Furthermore, in those memory cells MC which are coupled to the selected word line WL1 and non-selected column selection lines, the plate lines PL are in a floating state, so that the voltages across the opposite electrodes of those capacitors Cs will not change. Accordingly, the destruction of the polarization information in such memory cells MC is also prevented.

According to the present example, only one plate line (i.e., PL(0,j) in the above example) needs to be simultaneously driven by the plate driving signal generation circuit during one access operation. As a result, it becomes possible to access at least one memory cell through one access operation. Since the plate electrodes of only two capacitors are coupled to each plate line PL, the plate lines PL have a relatively small capacitance value and a resistance value. Thus, less time is required for driving the plate lines, whereby high-speed operation and low power consumption can be realized.

EXAMPLE 2

Hereinafter, Example 2 of the present invention will be described with reference to the figures.

Figure 4:
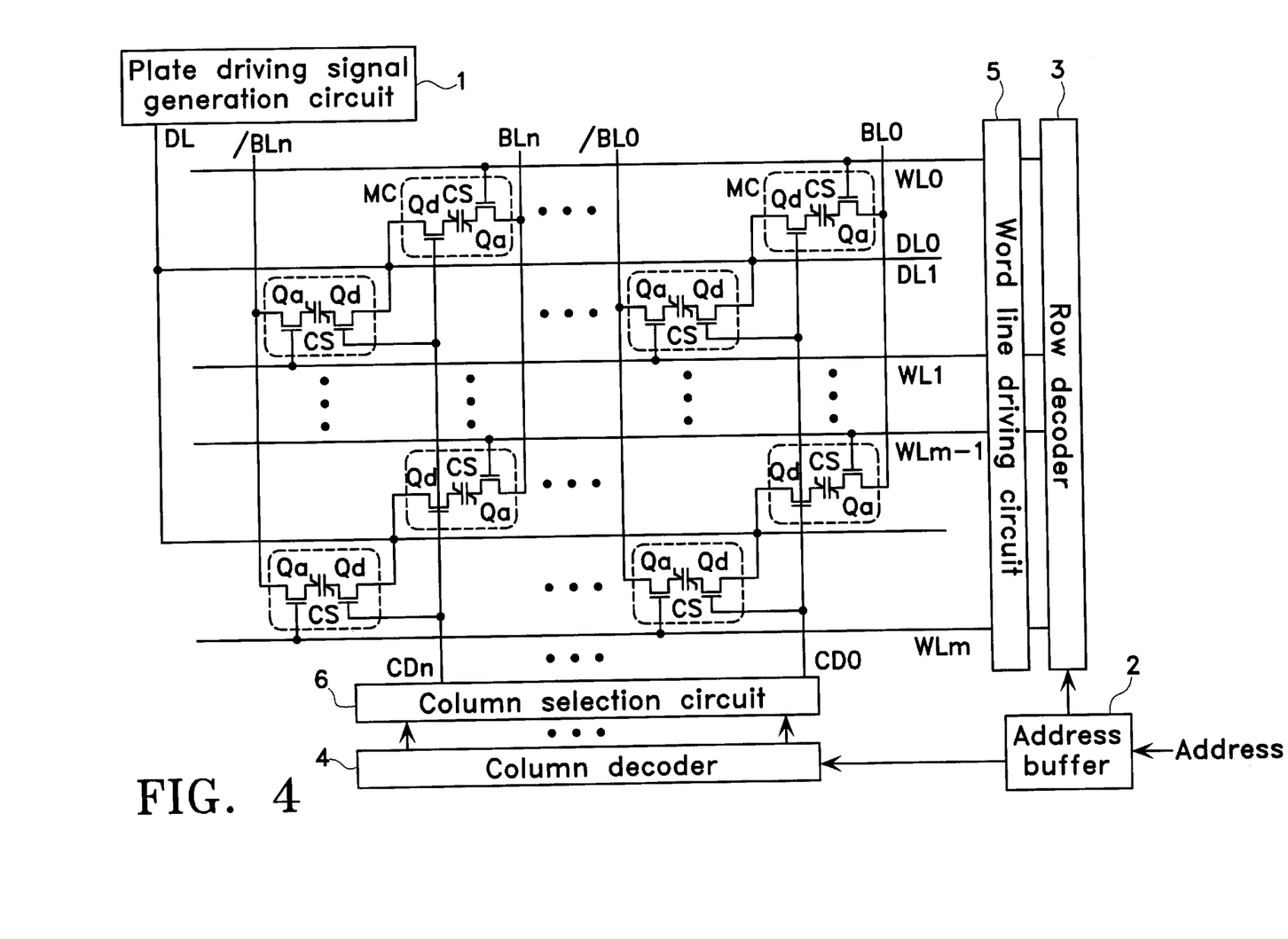
FIG. 4 is a circuit diagram illustrating a memory device according to Example 2 of the present invention.

FIG. 4 is a circuit diagram illustrating a memory device according to Example 2 of the present invention.

The memory device according to the present example includes a plurality of memory cells MC arranged in a matrix of rows and columns, where each memory cell MC includes a capacitor Cs consisting essentially of a ferroelectric film interposed between opposite electrodes, a transistor Qa whose source or drain is coupled to one of the electrodes of the capacitor Cs, and a transistor Qd whose source or drain is coupled to the other electrode (i.e., a "plate electrode") of the capacitor Cs.

The ferroelectric memory device further includes a plurality of word lines WL0 to WLm provided for the respective rows of memory cells MC so as to be coupled to the gates of the transistors Qa of the respective rows of memory cells MC for selecting one or more rows of memory cells MC.

The ferroelectric memory device further includes a plurality of bit lines BL0 to BLn and a plurality of bit lines /BL0 to /BLn provided for the respective columns of memory cells MC so as to be coupled to the drains or sources of the transistors Qa of the respective columns of memory cells MC.

With respect to each column, the drains or sources of the transistors Qd of the memory cells are coupled to a common drive line DL, and the gates of the transistors Qd are coupled to column selection lines CD0 to CDn.

The memory device further includes: an address buffer 2 for receiving an externally supplied address signal; a row decoder 3 and a column decoder 4 for receiving the outputs from the address buffer 2; a word line driving circuit 5 for receiving an address decode signal which is output from the row decoder 3 and driving the word lines; a column selection circuit 6 for receiving an address decode signal which is output from the column decoder 4 and generating column selection signals CD0 to CDn; and a plate driving signal generation circuit 1 which is coupled to the common drive line DL.

Herein, a plate electrode node of the capacitor Cs in a memory cell which is in the $i^{th}$ row and $j^{th}$ column will be denoted as PL(i,j).

Figure 5:
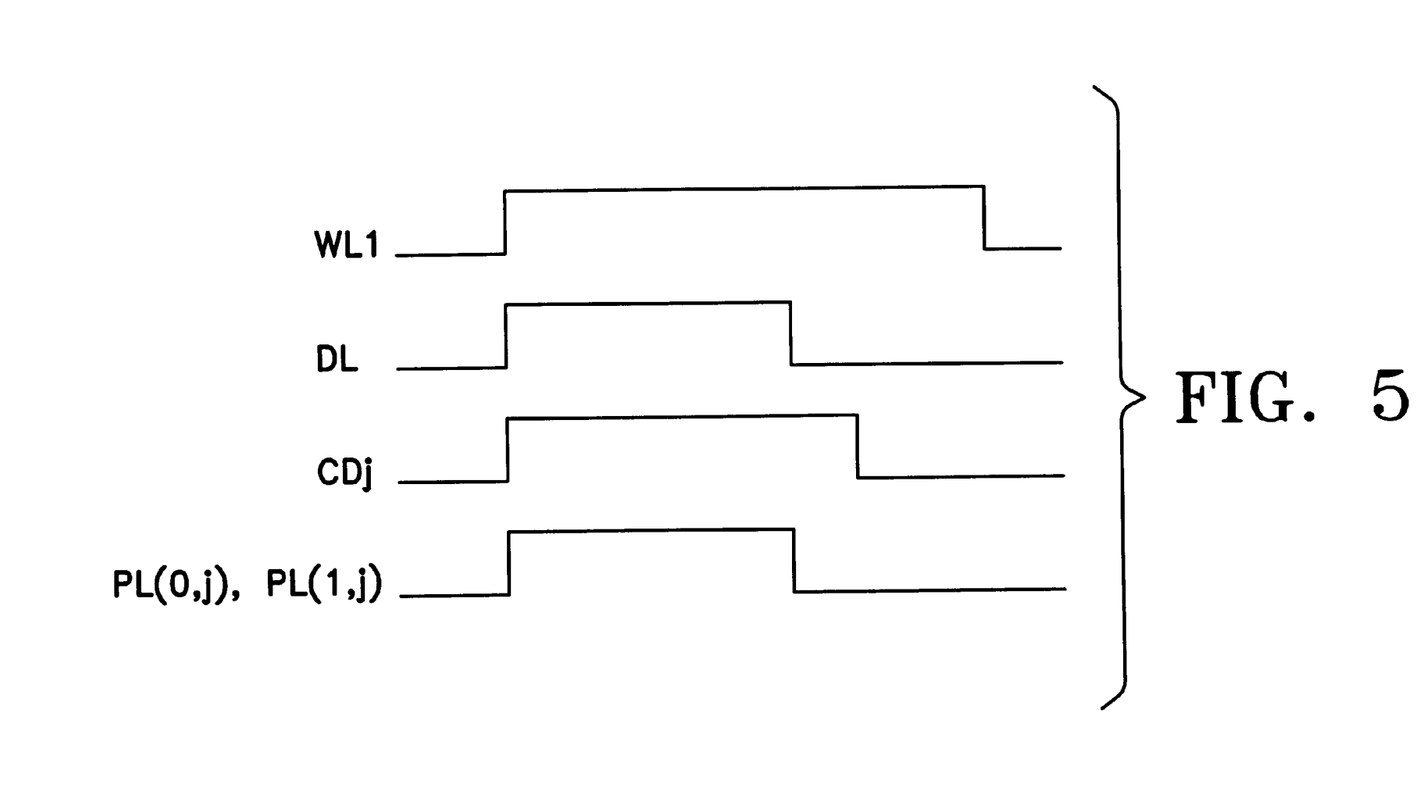
FIG. 5 is a timing diagram of various signals for illustrating the operation of the memory device according to Example 2 of the present invention shown in FIG. 4.

Hereinafter, the operation of the memory device shown in FIG. 4 will be described with reference to the timing diagram of FIG. 5 illustrating various signals.

In a stand-by state before the word line rises to a "selected" level (i.e., a HIGH level), the bit lines BL0 to BLn, bit lines /BL0 to /BLn, and the common drive line DL are at a ground potential.

An external address signal which is input to the address buffer 2 is passed to the row decoder 3 and the column decoder 4. The row decoder 3 decodes a row address from the external address signal; the column decoder 4 decodes a column address from the external address signal. The word line driving circuit 5 activates at least one of the word lines WL0 to WLm at an address corresponding to the row address which has been decoded by the row decoder 3, whereas the column selection circuit 6 activates at least one of the column selection lines CD0 to CDn at an address corresponding to the column address which has been decoded by the column decoder 4. The row decoder 3 and the word line driving circuit 5 may be collectively referred to as a "word line driving section", whereas the column decoder 4 and the column selection circuit 6 may be collectively referred to as a "column selection section".

As a word line (e.g., WL1) shifts to the "selected" level, the transistors Qa of the memory cells MC coupled to the word line WL1 become conductive. Next, a plate line driving voltage Vp1, which is output from the plate driving signal generation circuit 1, is supplied to the common drive line DL. Thereafter, as a column selection line (e.g., CDj) shifts to the "selected" level in response to an output signal from the column decoder 4, the transistors Qd in the $j^{th}$ column become conductive, so that the voltage Vp1 on the common drive line DL is supplied to the plate lines in the $j^{th}$ column, i.e., the plate lines PL(0,j), PL(1,j), . . . , and PL(m,j).

As a result, the information stored in the memory cells MC at the first row and the $j^{th}$ column is read onto the bit line /BLj.

The above operation will be described in more detail with reference to the hysteresis characteristics shown in FIG. 8. By applying a negative electric field −Emax between the bit line /BLj and the plate line PL(i,j) while the transistor Qa is in an ON state, a charge equivalent to Pmax+Pr will be read onto the bit line /BLj from a memory cell storing the data "1" (which corresponds to point c in the hysteresis curve), and a charge equivalent to Pmax−Pr will be read onto the bit line /BLj from a memory cell storing the data "0" (which corresponds to point a in the hysteresis curve).

A reference cell (not shown) is selectively coupled to the bit line BLj (which is complementary to the bit line /BLj) so as to place the bit line BLj at a reference voltage level.

The information which is stored in each selected memory cell can be read and becomes accessible from the outside by amplifying a differential voltage between the complementary pair of bit lines BLj and /BLj. Thereafter, the driving signal DL shifts to the ground potential while the column selection line CDj stays at the "selected" level, whereby the plate lines PL(0,j), PL(1,j), . . . , and PL(m,j) are placed at the ground potential. As a result, the information which was previously stored in the selected memory cells is rewritten thereto.

In accordance with the above-described operation, the capacitors Cs in the memory cells MC in the non-selected rows (i.e., rows other than the first row) are detached from the bit lines by the switching of the transistors Qa, so that the voltages across the opposite electrodes of those capacitors Cs will not change regardless of whether the voltage Vp1 is applied to the plate lines PL or not. Accordingly, the destruction of the polarization information in such memory cells MC is prevented.

Furthermore, in those memory cells MC which are coupled to the selected word line WL1 and non-selected column selection lines, the plate lines PL are in a floating state, so that the voltages across the opposite electrodes of those capacitors Cs will not change. Accordingly, the destruction of the polarization information in such memory cells MC is also prevented.

In accordance with the memory device of the present example, the plate driving signal generation circuit needs to drive one column of plate lines PL(0,j), PL(1,j), . . . , and PL(m,j) during one access operation. However, this does not substantially increase the time required for driving the plate lines because only the memory cell MC at the first line and the $j^{th}$ column needs to have its capacitor Cs charged. The present example provides an advantage in that a plurality of transistors T0, T1, . . . for coupling drive lines DL with a main drive line MDL as in Example 1 are not required, thereby simplifying the circuitry.

As will be understood by those skilled in the art, a similar circuit can be constructed by interchanging the source and the drain of each transistor employed in Example 1 or 2.

As described above, in accordance with the semiconductor memory device of the present invention, the plate lines of the respective memory cells are grouped along the row direction and/or the column direction so that the plate lines within only a limited range of are simultaneously driven during one access operation. In a minimum grouping configuration, the plate lines can be driven in a memory-cell-by-memory-cell manner. Thus, less time is required for driving the plate lines, whereby high-speed operation and low power consumption can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
    a plurality of word lines;
    a plurality of drive lines;
    a word line driving section for activating one of the plurality of word lines in accordance with a row address;
    a column selection section for, in accordance with a column address, selecting one of a plurality of ferroelectric memory cells coupled to the activated word line;
    a plate driving signal application section for applying a plate driving signal to at least a selected one of the plurality of drive lines, the at least one selected drive line being associated with the activated word line; and
    a switching section for coupling or detaching the plurality of ferroelectric memory cells to or from the at least one selected drive line,
    wherein the column selection section controls the switching section so that only the selected ferroelectric memory cell is coupled to the at least one selected drive line.

2. A semiconductor memory device according to claim 1, wherein the switching section couples or detaches the plurality of ferroelectric memory cells to or from the at least one selected drive line with respect to each of the plurality of word lines.

3. A semiconductor memory device according to claim 1, wherein each of the plurality of drive lines is associated with more than one of the plurality of word lines, the plate driving signal application section applying the plate driving signal to the drive line associated with any of the activated word lines.

4. A semiconductor memory device according to claim 1, wherein each of the plurality of drive lines is associated with one of the plurality of word lines, the plate driving signal application section applying the plate driving signal to the drive line associated with the activated word line.

5. A semiconductor memory device according to claim 4, wherein each of the plurality of ferroelectric memory cells includes at least one capacitor having two electrodes and at least one transistor, the two electrodes of the capacitor being respectively coupled to one of a source and a drain of the at least one transistor and to the switching section, the gate of the at least one transistor being coupled to one of the plurality of word lines.

6. A semiconductor memory device comprising:
    a plurality of word lines;
    a plurality of drive lines;
    a word line driving section for activating one of the plurality of word lines in accordance with a row address;
    a column selection section for, in accordance with a column address, selecting one of a plurality of ferroelectric memory cells coupled to the activated word line;
    a plate driving signal application section for applying a plate driving signal to one of the plurality of drive lines associated with the activated word line, each of the plurality of drive lines being associated with one of the plurality of word lines,
    wherein the column selection section couples only the selected ferroelectric memory cell to the one of the plurality of drive lines.

7. A semiconductor memory device according to claim 6, wherein each of the plurality of ferroelectric memory cells includes a first transistor, a second transistor, and at least one capacitor having two electrodes, the two electrodes of the capacitor being respectively coupled to one of a source and a drain of the first transistor and to one of a source and a drain of the second transistor, the gate of the first transistor being coupled to one of the plurality of word lines, the other of the source and the drain of the second transistor being coupled to one of the plurality of drive lines associated with one of the plurality of word lines, and the gate of the second transistor being coupled to the column selection section, and
    wherein the column selection section controls the second transistor so as to couple only the selected ferroelectric memory cell to the one of the plurality of drive lines.

8. A semiconductor memory device comprising:
    a plurality of word lines;
    a word line driving section for activating at least one of the plurality of word lines in accordance with a row address;
    a column selection section for, in accordance with a column address, selecting one of a plurality of ferroelectric memory cells coupled to the at least one activated word line;
    a plate driving signal application section for applying a plate driving signal to a plurality of drive lines coupled to the plurality of ferroelectric memory cells; and
    a switching section for coupling or detaching the plurality of ferroelectric memory cells to or from the at least one of the plurality of drive lines,
    wherein each of the plurality of ferroelectric memory cells includes a first transistor, a second transistor, and at least one capacitor having two electrodes, one of the two electrodes of the capacitor being coupled to one of a source and a drain of the first transistor, the other of the two electrodes of the capacitor being coupled to one of a source and a drain of the second transistor, the gate of the first transistor being coupled to one of the plurality of word lines, the other of the source and the drain of the second transistor being coupled to one of the plurality of drive lines, and the gate of the second transistor being coupled to the column selection section, and
    wherein the column selection section controls the switching section so that only the selected ferroelectric memory cell is coupled to the one of the plurality of drive lines.

* * * * *